United States Patent
Egger et al.

[11] Patent Number: 6,010,057
[45] Date of Patent: Jan. 4, 2000

[54] METHOD FOR MAKING A WIRE CONNECTIONS OF PREDETERMINED SHAPE

[75] Inventors: Hans Egger, Knonau; Daniel Von Flüe, Cham; Zeno Stössel, Baar, all of Switzerland

[73] Assignee: Esec Sa, Cham, Switzerland

[21] Appl. No.: 08/807,077

[22] Filed: Feb. 27, 1997

[30] Foreign Application Priority Data

Mar. 2, 1996 [CH] Switzerland ............... 0540/96

[51] Int. Cl.$^7$ ............................................. H01L 21/60
[52] U.S. Cl. .............. 228/102; 228/180.5; 228/179.1; 228/4.5; 228/8; 228/12; 219/385
[58] Field of Search ................... 228/102, 180.5, 228/179.1, 4.5, 8, 12; 219/385

[56] References Cited

U.S. PATENT DOCUMENTS

| | | |
|---|---|---|
| 4,327,860 | 5/1982 | Kirshenboin et al. . |
| 4,445,633 | 5/1984 | Bonham, Jr. . |
| 4,597,522 | 7/1986 | Kobayashi . |
| 4,903,883 | 2/1990 | Thurlemann et al. . |
| 5,111,989 | 5/1992 | Holdgrafer et al. . |
| 5,114,302 | 5/1992 | Meisser et al. . |
| 5,150,828 | 9/1992 | Shimizu ................................ 228/102 |
| 5,205,463 | 4/1993 | Holdgrafer et al. ................... 228/102 |
| 5,269,452 | 12/1993 | Sterczyk . |
| 5,297,722 | 3/1994 | Takahashi et al. . |
| 5,458,280 | 10/1995 | Nishimaki et al. ..................... 228/102 |

FOREIGN PATENT DOCUMENTS

| | | |
|---|---|---|
| 0 792 716 | 2/1997 | European Pat. Off. . |
| 43 35 468 | 10/1993 | Germany . |

*Primary Examiner*—Patrick Ryan
*Assistant Examiner*—M. Alexandra Elve
*Attorney, Agent, or Firm*—McCormick, Paulding & Huber LLP

[57] ABSTRACT

In wire bonding a semiconductor chip to the lead frame or other substrate, increase of productivity is achieved by letting the capillary which guides the wire between the wiring points (4, 5) move faster along its trajectory in the two travel stages (s1, s2). The capillary's drives in the horizontal (x, y) and vertical (z) directions are programmed by presetting the speed (vH) of the horizontal component of the movement and then calculating the vertical speed (vV) as a dependent variable based on the given trajectory. In determining said horizontal speed (vH) to be preset, the maximum horizontal and/or vertical acceleration values (aH*, aV*) associated with the drive mechanism are taken into account. Further time can be saved by letting the horizontal travel begin during the first travel stage (s1) and, by simultaneous vertical and horizontal travel, producing a steady transition (point k') from the first stage (s1) to the second (s2).

4 Claims, 2 Drawing Sheets

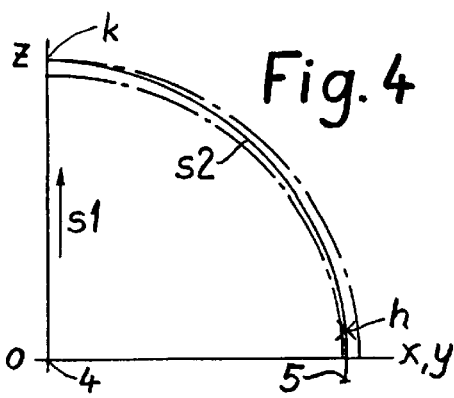
Fig. 4
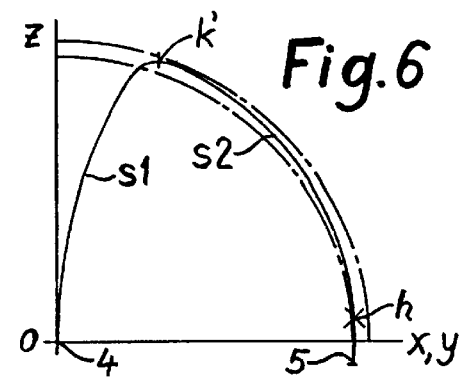
Fig. 6
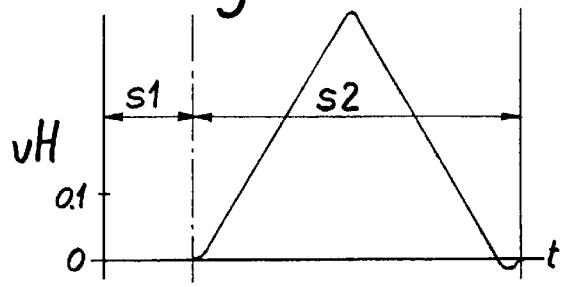
Fig. 5
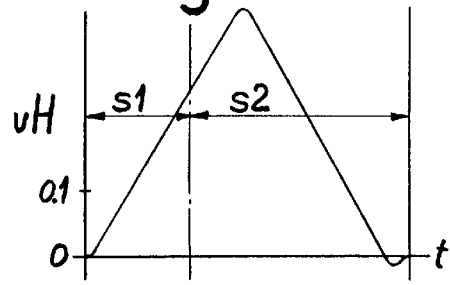
Fig. 7
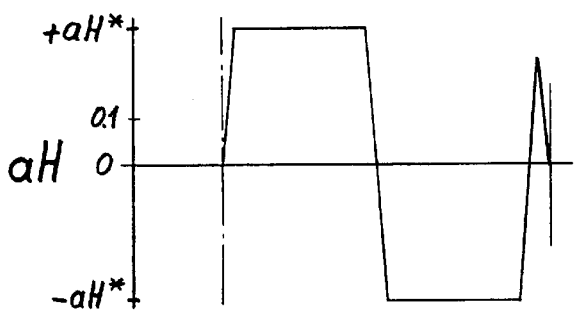
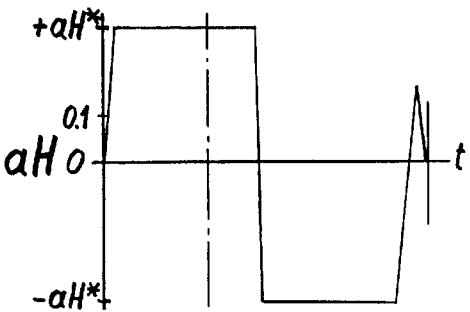
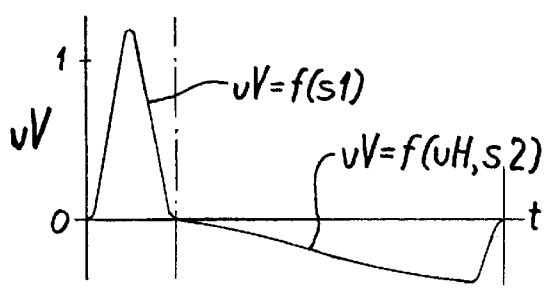
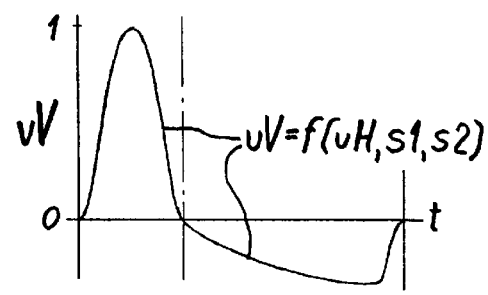
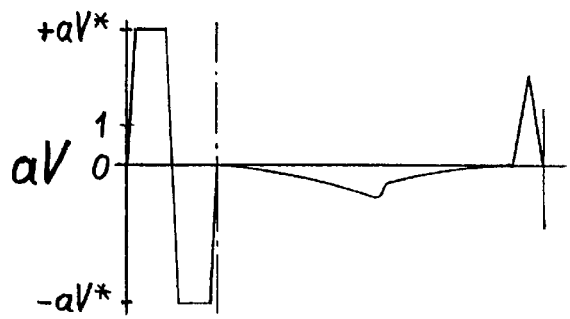
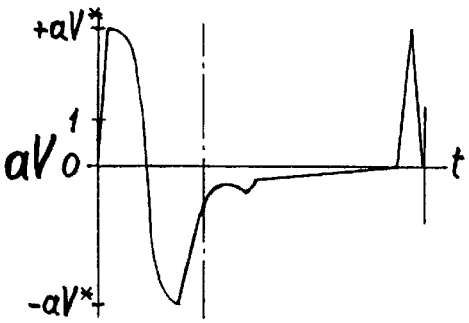

METHOD FOR MAKING A WIRE CONNECTIONS OF PREDETERMINED SHAPE

BACKGROUND OF THE INVENTION

The present invention relates to a method for making a wire connection of predetermined shape between a first wiring point located on a semiconductor chip and a second wiring point. Such wire connections are used in semiconductor assembly to form electrical connections to an integrated circuit located on the chip. The second wiring point of the connection may typically be on a so-called metal lead frame or on another substrate, for example a printed circuit with a plastic, ceramic, or so-called ball-grid-array substrate, or else on another semiconductor chip, as would be the case in arrangements of several chips on the same substrate (so-called multi-chip devices).

PRIOR ART

In known methods for making such wire connections a wire runs through a movable capillary which is guided horizontally and vertically by a programmable drive mechanism and which attaches the wire to both wiring points and guides the wire between the wiring points. Each time after the wire is attached to the first wiring point the aforesaid drive mechanism moves the capillary along a specified trajectory to the second wiring point. This trajectory is determined by the positions of the wiring points and the desired or required geometry of the formed wire bridge. Generally, in a first stage of its travel, the capillary is moved more or less vertically upward, in order to pull through the required length of wire (this is sometimes combined with a preforming of the wire). Then, in a second stage of its travel, the capillary is guided in a downward arc to the second wiring point.

This process, also known as "wire bonding", is widely used in the semiconductor industry. Suitable drive mechanisms for the capillary are known, for example from U.S. Pat. Nos. 5,114,302 and 4,903,883, and various trajectory curves of the capillary for the production of particular shapes of wire bridges are described for example in U.S. Pat. Nos. 4,327,860, 5,111,989, and 5,205,463. Depending on their size and type, the semiconductor chips often need a large number of such wire connections extending from closely adjacent positions on the surface of the chip. For this reason the accuracy of the shape and the mechanical stability of the wire bridges, and hence the capillary's trajectories, must meet very strict requirements. Efforts to date in prior art have therefore been directed mainly toward the precise production and maintenance of particular shapes of trajectory. But this demands correspondingly high computing capability and time by the processors that control the trajectory, hence the mechanisms that guide the capillary generally cannot make full use of the maximum speed of travel of which they are inherently capable.

SUMMARY OF INVENTION

A principal object of the present invention is the further development of the aforesaid method in such a manner as to make the capillary's total travel along the trajectory faster. For this purpose the dynamic potential available in the drive mechanism is to be exploited to its limits, in order to increase the productivity of the automatic equipment used.

According to the invention, these and other objects are achieved in that, in programming the drive mechanism, the speed of the horizontal component of the movement—at least for the second of the two travel stages mentioned above—is preset, and the speed of the vertical component of the movement is then calculated on the basis of said preset horizontal speed component and of the specified trajectory, whereby, in determining the values of the horizontal speed component, the maximum permissible horizontal and/or vertical acceleration values (associated with the drive mechanism guiding the capillary) are taken into account.

Thus the method according to the invention does not only or primarily concentrate upon the maintenance of a given trajectory, i.e. the coordination of horizontal and vertical travel, but above all aims at predetermining or presetting high horizontal speeds, in order to attain as far as possible the drive mechanism's permissible rates of acceleration. For this purpose, the invention also makes use of the circumstance—to date not taken into account—that the capillary's vertical movement is generally much less subject to inertia than its horizontal travel. As a result, the vertical component, being a dependent variable, can practically always meet or "follow" the given trajectory.

In prior art the first and generally vertical travel stage that pulls through a required length of wire (sometimes combined with preforming of the wire), always ends when the capillary stops at the highest point of the trajectory. The then following downward arc begins with a more or less horizontal tangent. The said intermediate stop and the inherent sharp change of direction in the capillary's trajectory causes further delay in the sequence of movements.

A preferred embodiment of the method according to the present invention thus consists in letting the horizontal movement start sooner, namely during the first travel stage, and creating a steady transition in the trajectory from the first to the second travel stage by simultaneous horizontal and vertical movements. This makes it possible to achieve further substantial savings of time by comparison with the previously described "sequential" movement in two stages separated by an intermediate stop.

BRIEF DESCRIPTION OF DRAWINGS

The present invention is described below in greater detail by reference to various typical embodiments and the following drawings:

FIG. 4 shows a simple first typical embodiment of a trajectory along which the capillary moves from the first to the second wiring point;

FIG. 5 shows the corresponding time graphs for the horizontal and vertical speeds and rates of acceleration;

FIG. 6 shows a second typical embodiment of the capillary's trajectory; and

FIG. 7 shows, analogous to FIG. 5, the time graphs for the trajectory shown in FIG. 6.

DESCRIPTION OF THE PREFERRED EMBODIMENTS

Figure 1:
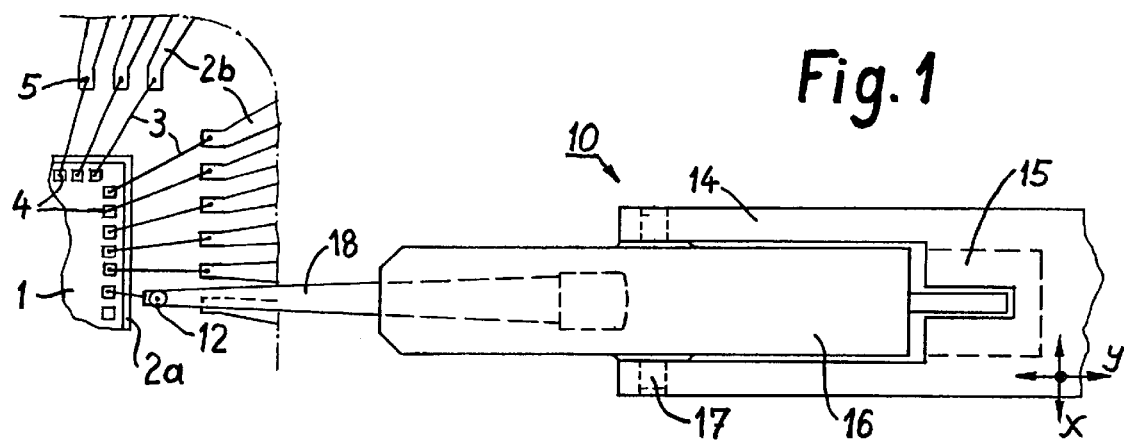
FIG. 1 is a simplified plan view from above of an arrangement known per se for applying the method.
Figure 2:
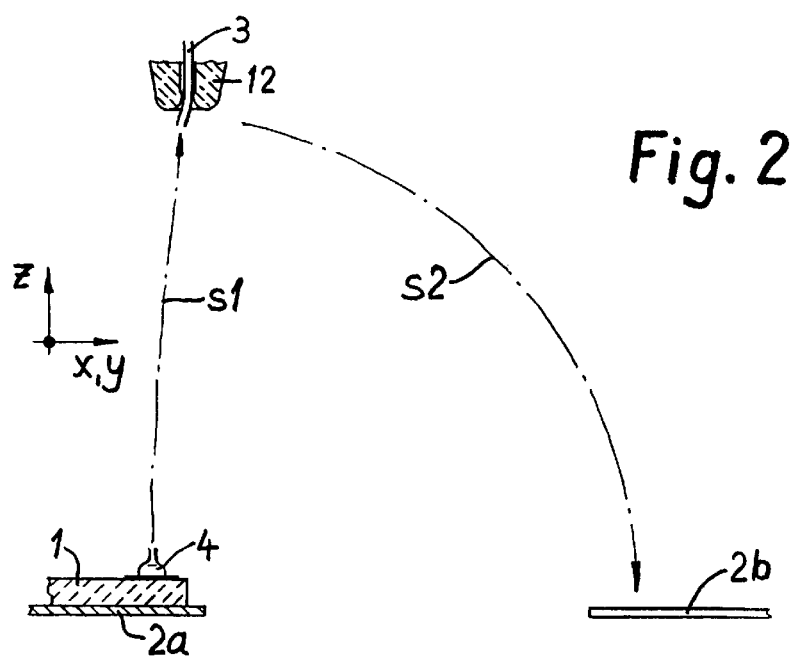
FIG. 2 is a greatly enlarged part elevation of the arrangement shown in FIG. 1.

FIGS. 1 and 2 show diagrammatically a general arrangement by which the method described in the present disclosure is carried out. The left of FIG. 1 shows as workpiece a semiconductor chip 1 fitted on a lead frame substrate, both broken away in part. The main features of the substrate, which is typically made of diestamped or etched thin copper sheet, are a mounting pad 2a that supports the chip 1 and contact fingers 2b all around it.

In the process described as "wire bonding", shaped wire connections 3 are made between the first wiring points 4 located on the chip's surface and the second wiring points 5 on the contact fingers 2b. The connections 3 are made with fine wire that runs from above through a capillary 12 capable of horizontal and vertical travel (FIG. 2). The capillary is used, on the one hand, to bond the wire to points 4 and 5 and, on the other, to guide the wire between these points.

The capillary 12 forms part of a known microprocessor-controlled device 10 that performs the requisite travel cycles. A slide 14 of the device 10 performs horizontal movements in x and y as shown in FIG. 1. It is driven in a manner known per se but not shown in detail, for example by a linear motor. In the typical embodiment shown, the slide 14 supports a rocker 16 which together with an arm 18 attached thereto can pivot about a horizontal axle 17 (as an alternative, vertically extending linear guides for the arm are also known). A (linear) motor 15 on the slide 14 acts as the pivot drive that effects the vertical movements (direction z in FIG. 2) of the capillary 12 fitted to the end of arm 18. The arm 18 also transmits to the capillary 12 the ultrasonic energy necessary for bonding the wire 3 at points 4 and 5. Above the capillary there is usually a controllable wire clamp (not shown) by which it is possible to stop the wire being pulled through or to allow it to pass.

Figure 3:
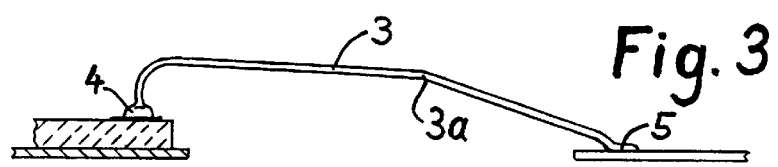
FIG. 3 shows a typical example of a completed wire connection.

On a given workpiece the positions of all wiring points 4 and 5 are known, and the general shape of the wire bridges 3 is specified, in particular their maximum permissible height. From these data the directions of the various wire bridges, namely their x and y components in FIG. 1, and the length of wire that each requires, are defined as basic data for programming the travel cycles of the capillary. In each case starting at a point 4 on the chip 1 to which the wire is bonded first, the capillary 12 travels along a given trajectory to an associated second point 5. There are generally two distinct stages of travel or sections of trajectory (FIG. 2). The first travel stage s1 is more or less vertical and up from the chip 1, in order to pull the required length of wire through the capillary. The second stage s2 is a downward arc to the level of the contact finger 2b. In some cases, depending on the specified geometry of the wire bridge, the wire must be preformed during the first stage which also requires brief horizontal movements by the capillary. The finished wire bridge 3 shown in FIG. 3, for example, has a kink 3a preformed during the first travel stage s1 in a manner known per se.

The following refers to a first typical embodiment of the method according to the invention, by reference to FIG. 4 and the associated time graphs in FIG. 5. In the trajectory of the capillary shown in FIG. 4, it is assumed that the first travel stage s1 from the first wiring point 4 is made directly upward in a vertical direction to the highest point k of the trajectory, as would be the case for a relatively simple wire bridge without preforming. The second stage s2 follows this and starts with a practically horizontal tangent; in other words, the trajectory is discontinuous, with a sharp change of direction at point k. During the capillary's subsequent lateral and downward travel a kink forms in the wire 3, and this normally prevents more wire being pulled through the capillary, if necessary supported by a controlled action of the wire clamp. The geometry of the arc to the wiring point 5 shown in stage s2 typically forms part of a spiral that runs between a pair of concentric circular arcs shown by dash-dotted lines. Near the lower end of the arc s2 it is desirable to define a point h at a given height where a special stopping sequence and the approach of the capillary 12 to the contact finger 2b are initiated. The second travel stage s2 ends at point 5 with the bonding of the wire to the contact finger 2b.

Below one another in FIG. 5 are the associated time functions of horizontal speed vH, horizontal acceleration aH, vertical speed vV, and vertical acceleration aV, all at the same time scale. But for the ordinates in the graphs of the horizontal and vertical speeds and rates of acceleration, the scales vary considerably from one another, as shown by comparison marks on the ordinate axes for the relative values (0.1 and 1 respectively). The same also applies to the graphs shown in FIG. 7 and described later below.

According to FIGS. 4 and 5, in the first travel stage s1 there is no horizontal movement. For the vertical movement a speed gradient vV=f(s1) is preset or predetermined. It is made up of an acceleration and a deceleration section applicable to the straight vertical part of the trajectory. The rate of increase and decrease in speed is calculated to achieve the maximum rates of permissible vertical acceleration and deceleration +aV* and −aV* inherent to the particular drive mechanism.

For the second stage s2 that follows directly upon the compulsory stop (vV=O, vH=O) at point k, the horizontal speed vH is predetermined. This consists mainly of a section in which there is a linear increase in speed, followed by a section in which there is a linear decrease in speed. In turn this is followed by the stopping sequence when level h is reached. The gradient or slope of these sections is calculated so as to maintain the maximum permissible rates of horizontal acceleration +aH* and deceleration −aH* respectively over a substantial part of stage s2; slight deviations at the beginning of this stage and at the transition from acceleration to deceleration are mainly due to given voltage limitations in the drive motors. The gradient of the vertical speed vV and vertical acceleration aV are calculated as a dependent variable of the specified speed gradient vH=f(t) and the geometrically specified part s2 of the trajectory as referred to above. FIG. 5 shows that the limiting values +aV* and −aV* are not reached; in other words, in this stage the limit is given by the maximum permissible horizontal acceleration. These graphs also show that in both travel stages s1 and s2, the capillary to a large extent moves along its trajectory at maximum permissible speed.

The further typical embodiment according to FIGS. 6 and 7 demonstrates that a substantial further reduction is possible in the time taken to travel along a trajectory from the first wiring point to the second. The time scale in each of the graphs in FIG. 7 is identical with those in FIG. 5, and the same distance between wiring points 4 and 5 is assumed. The trajectory in FIG. 6 differs from that in FIG. 4 in that the sharp change of direction at point k in FIG. 4 is avoided and, instead, a steady transition from section s1 to s2 at the trajectory's highest point k' is provided. This can also be defined by stating that section s1 asymptotically approaches a theoretical backward projection of section s2 (or section s2 in FIG. 4). FIG. 7 shows that such a steady transition can be achieved by letting the predetermined horizontal movement begin sooner, namely in the first travel stage s1. Thus, by contrast with the embodiment according to FIGS. 4 and 5, simultaneous vertical and horizontal travel already occurs in stage s1. The vertical speed vV and the corresponding vertical acceleration aV are again calculated as dependent variables based on the predetermined horizontal speed vH and the given trajectory, but in this case already in the first stage s1. For the settings of the positive and negative slopes of the speed vH, the maximum permissible rates aH* and aV* of both the horizontal and the vertical accelerations must be taken into account.

Analogously, but as a variant from the embodiment shown in FIGS. 6 and 7, continuous transition in the trajectory at a point k' between the stages s1 and s2 can also be achieved when the wire is preformed during the first stage. In that case the rising part of the trajectory leading to the point of transition k' does not originate at the wiring point 4, but connects with the capillary's particular preforming movements which precede and also include lateral travel. The calculation of the trajectory and the sequence of movement in the subsequent section s1 are analogous, but with a starting point accordingly offset. This also applies if—as a variant of the embodiment shown in FIGS. 4 and 5—it is required to preform the wire immediately after bonding it to wiring point 4; the travel in section s1 is then no longer vertical from point 4, but from the end point of the preforming movements obliquely upward to the point k at which the trajectory changes direction.

It should be pointed out that in some cases, notably where particularly strict requirements have to be met as regards the accuracy and uniformity of the wire bridges, it may not be possible to exploit to the full the drive mechanism's mechanical limit values in x, y, and z. Moreover, an intrinsically desirable, continuous trajectory at point k' (FIG. 6) may result in greater variations in the length of wire dispensed and may in turn lead to corresponding deviations in the geometry of the wire bridges. But it is possible to overcome this problem at least to some extent by appropriate control of a wire clamp fitted above the capillary as referred to above.

We claim:

1. A method of making of making a wire connection of predetermined shape between a first wiring point located on a semiconductor chip and a second wiring point in which a wire passes through a capillary movable horizontally and vertically by means of a programmable drive mechanism that is used both to bond the wire to the two wiring points and to guide the wire between the two bonding points, comprising the steps of:

guiding the capillary along a specified trajectory to the second wiring point by means of the drive mechanism after the wire has been attached to the first wiring point, wherein the trajectory includes a first travel stage extending more or less vertically upward in order to pull through the required length of wire, and a second travel stage extending in a downward arc to the second wiring point;

presetting the speed of the horizontal component of movement of the capillary at least in the second travel stage; and calculating the vertical component of movement of the capillary based on the preset speed of the horizontal component and the specified trajectory such that the presetting of the speed of the horizontal component of movement is based upon the maximum permissible values of the horizontal and/or vertical acceleration of the drive mechanism.

2. A method as defined in claim 1, further comprising the steps of:

programming a horizontal movement to start during the first travel stage; and producing a steady transition of the trajectory from the first travel stage to the second travel stage by simultaneous coordinated vertical and horizontal movements.

3. A method as defined in claim 1, further comprising the step of producing preforming movements of the capillary starting at the first wiring point, wherein the first travel stage originates at an end point of the preforming movements.

4. A method as defined in claim 2, further comprising the step of producing preforming movements of the capillary starting at the first wiring point, wherein the first travel stage originates at an end point of the preforming movements.

* * * * *

UNITED STATES PATENT AND TRADEMARK OFFICE
CERTIFICATE OF CORRECTION

PATENT NO. : 6,010,057
DATED : January 4, 2000
INVENTOR(S) : Hans Egger et al.

It is certified that error appears in the above-identified patent and that said Letters Patent is hereby corrected as shown below:

Title:
    Front page, item 54, after "MAKING" please delete "A" in the first line of the title.

Assignee:
    Front page, item 73, please delete "Esec. Sa." and insert --ESEC SA--.

Col. 5, Claim 1, line 1, please delete "of making" (second occurrence).

Signed and Sealed this

Twenty-first Day of November, 2000

Attest:

Q. TODD DICKINSON

*Attesting Officer*   *Director of Patents and Trademarks*